(12) United States Patent
Kim

(10) Patent No.: US 6,625,775 B1
(45) Date of Patent: Sep. 23, 2003

(54) ENCODER/DECODER WITH SERIAL CONCATENATED STRUCTURE IN COMMUNICATION SYSTEM

(75) Inventor: Min-Goo Kim, Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/459,050

(22) Filed: Dec. 10, 1999

(30) Foreign Application Priority Data

Dec. 10, 1998 (KR) .......................................... 98-54130

(51) Int. Cl.$^7$ .............................................. H03M 13/00

(52) U.S. Cl. ...................................... 714/755; 714/781

(58) Field of Search ................................ 714/701, 752, 714/753, 755, 756, 758, 761, 762, 781, 782, 784, 785, FOR 102

(56) References Cited

U.S. PATENT DOCUMENTS

| 5,721,745 | A | * | 2/1998 | Hladik et al. | ................ | 714/755 |
| 5,983,383 | A | * | 11/1999 | Wolf | ............................ | 714/755 |
| 5,996,104 | A | * | 11/1999 | Herzberg | ..................... | 714/755 |
| 6,023,783 | A | * | 2/2000 | Divsalar et al. | ............ | 714/792 |
| 6,192,501 | B1 | * | 2/2001 | Hladik et al. | ................ | 714/786 |

FOREIGN PATENT DOCUMENTS

| JP | 06-205054 | 7/1994 |
| JP | 07-022968 | 1/1995 |
| JP | 08-251144 | 9/1996 |
| JP | 10-154942 | 6/1998 |
| JP | WO 99/12265 | 3/1999 |
| JP | 11-215012 | 8/1999 |

OTHER PUBLICATIONS

"Iterative MAP decoding for serial concatenated convolutional codes", Ambroze, Wade, Tomlinson; IEEE Proceedings on Communications; vol. 145, No. 2, Apr. 1998, pp. 53–59.*
"Serial Concatenation of Interleaved Codes: Performance Analysis, Design, and Iterative Decoding", Benedetto, Divsalar, Montorsi, Pollara; IEEE Transactions on Information Theory, vol. 44, No. 3, May 1998, pp. 909–926.*
"Serial Concatenation of Block and Convolutional Codes", Benedetto, Montorsi; IEEE Electronic Letters, vol. 32, No. 10, May 9$^{th}$, 1996, pp. 887–888.*
"A Soft–Input Soft–Output Maximum A Posteriori (MAP) Module to Decode Parallel and Serial Concatenated Codes", Benedetto, Divsalar, Montorsi, Pollara; TDA Progress Report 42–127 for NASA and Cal Tech JPL, Nov. 15$^{th}$, 1996, pp. 1–20.*
Japanese Office Action dated Sep. 17, 2002 issued in a counterpart application, namely, Appln. No. 2000–587451.
Japanese Office Action dated Mar. 25, 2003, issued in a counterpart application, namely, Appln. No. 2000–587451.

* cited by examiner

Primary Examiner—Albert Decady
Assistant Examiner—Matthew C. Dooley
(74) Attorney, Agent, or Firm—Dilworth & Barrese, LLP

(57) ABSTRACT

A decoding device for decoding an input codeword bit stream using a generator polynomial represented by the product of a plurality of sub-polynomials disclosed. The decoding device comprises a plurality of serial concatenated decoders each having different generator polynomials, wherein a product of the different generator polynomials becomes said generator polynomial, the different generator polynomials are represented by the different sub-polynomials or by a product thereof, and a first-stage decoder out of the serial concatenated decoders receives said codeword bit stream. The decoders each perform soft decision, and the codeword is a linear block code.

17 Claims, 5 Drawing Sheets

ENCODER/DECODER WITH SERIAL CONCATENATED STRUCTURE IN COMMUNICATION SYSTEM

BACKGROUND OF THE INVENTION

1. Field of the Invention

The present invention relates generally to an encode/decoder in a radio communication system, and in particular, to a device for encoding/decoding linear block codes through an analysis of serial concatenated codes.

2. Description of the Related Art

In the current state of the art, it is very difficult to perform complete soft decision on linear block codes. This technical field is related to soft decision of error correction codes and optimal performance of linear block codes, and in particular, to a decoding method for turbo codes. In addition, this field is extensively related to reliability improvement of digital communication systems, including not only existing digital communication systems but also future mobile communication systems using linear block codes.

Referring to FIG. 1, there is shown a block diagram illustrating a conventional device for encoding and decoding an (n,k) linear block. An encoder 111 and a decoder 112 perform the encoding and decoding of the signals.

Conventionally, erasure decoding and trellis decoding are used for soft decision of the linear block codes. However, such decoding methods are disadvantageous in that an increase in redundancy (n−k) of the linear block codes causes geometric progression of the complexity. Ideally, for a (n,k) linear block code, it is possible to perform soft decision by determining a trellis having $2^{(n-k)}$ states and then performing maximum likelihood (ML) decoding on the trellis. However, since most linear block codes have a great number of redundancy bits, the actual complexity increases exponentially, which makes it difficult to implement the decoding method. In addition, since the existing ML (Maximum likelihood) decoding uses a method of determining an ML (maximum likelihood) codeword, it is not a preferable method for minimizing a post information bit error probability. Therefore, a decoding method for minimizing the post information bit error probability is required.

The above-stated conventional decoding method has the following disadvantages:

First, an increase in redundancy (n−k) of the linear block codes causes geometric progression of the complexity. In addition, since the linear block codes have a great number of redundancy bits, the actual complexity increases exponentially, thus making it difficult to implement the decoding method.

Second, the conventional method is not a preferable method for minimizing the post information bit error probability. Therefore, a method for minimizing the post information bit error probability is required.

Third, erasure decoding is not optimal decoding, but suboptimal decoding.

SUMMARY OF THE INVENTION

It is, therefore, an object of the present invention to provide a device for encoding linear block codes based on serial concatenation in a communication system.

It is another object of the present invention to provide a device for decoding linear block codes based on serial concatenation in a communication system.

To achieve the above objects, a decoding device for decoding an input codeword bit stream using a generator polynomial represented by product of a plurality of sub-polynomials is provided. The decoding device comprises a plurality of serial concatenated decoders each having different generator polynomials, wherein a product of the different generator polynomials becomes said generator polynomial, the different generator polynomials are represented by the different sub-polynomials or by a product of the sub-polynomials, and a firststage decoder out of the serial concatenated decoders receives said codeword bit stream. The decoders each perform soft decision, and the codeword is a linear block code.

In addition, there is provided an encoding device for encoding input information bits using a generator polynomial represented by a product of a plurality of sub-polynomials. The encoding device comprises a plurality of serial concatenated encoders each having different respective generator polynomials, wherein said generator polynomial is a product of the respective generator polynomials and each respective generator polynomial is represented by one of the plurality of sub-polynomials or by a product of sub-polynomials, and a first-stage encoder out of the serial concatenated encoder receives said input information bits.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
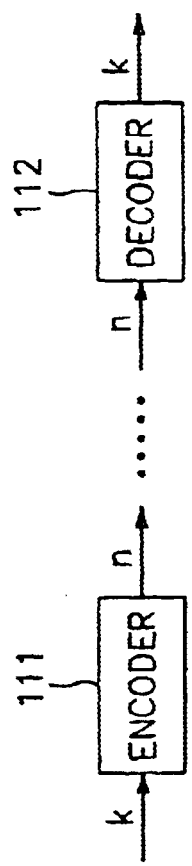
FIG. 1 is a block diagram illustrating a conventional device for encoding and decoding an (n,k) linear block.

A preferred embodiment of the present invention will be described herein below with reference to the accompanying drawings. In the following description, well-known functions or constructions are not described in detail to avoid obscuring the invention in unnecessary detail.

The present invention includes a new encoding method for encoding serial concatenated codes by modifying an existing encoder for encoding linear block codes. In the decoding method, the trellis structure of a codeword analyzed with the serial concatenated codes has a very low complexity as compared with the trellis structure of the existing linear block codes. Further, the invention includes a method for embodying a decoding method corresponding to the above encoding method, using an ML decoder or a MAP decoder (Maximum A Posteriori probability). The invention also includes an iterative decoding algorithm and method for decoding the structured codeword at a receiver.

With regard to an encoder, a description will be made of an encoder for encoding BCH codes and Reed-Solomon codes, which are typically used as linear block codes. Thereafter, it will be proven that the existing generator polynomial is identical to serial concatenation of generator polynomials of a new codeword defined by a plurality of sub-codes. Based on this analysis, the specification will show that the existing linear block codes can be divided into a plurality of subcodes, and then describe a method for serially concatenating the sub-codes and a detailed solution thereof. In addition, a description will be made of the conventional method for performing trellis decoding, regarding a predetermined linear block code as a single code, and the proposed method for determining a trellis of the sub-codes and then performing decoding based on the determined trellis.

With regard to a decoder, the specification will present an iterative decoding method for decoding the codes, and show several embodiments. Further, the specification will propose a method for utilizing extrinsic information for iterative decoding depending on the amount of information (i.e., traffic) output from each component decoder. Also, a reference will be made to an iterative decoding method and a deinterleaver for performance improvement. In addition, a combining method using the traffic of a channel will be described.

Now, a description will be made of an encoder for encoding linear block codes through an analysis of serial concatenated codes.

For a generator polynomial of a given (n,k) BCH code C, a selected one of primitive polynomials in a Galois field $GF(2^m)$ is used. In general, a codeword $C(x)$ of a BCH code is represented by a product of polynomials as shown in Equation (1) below. When a generator polynomial of the used code is $g(x)$ and a polynomial of input information is $I(x)$, a codeword $C(x)$ generated from the encoder is given by the equation:

$$C(x)=g(x)I(x) \quad (1)$$

Here, the generator polynomial $g(x)$ of the BCH code is comprised of LCM (Lowest Common Multiple) of several sub-polynomials as shown in Equation (2) below:

$$g(x) \text{ LCM}\{m1(x), m2(x), \ldots, mt(x)\} \quad (2)$$

where $mi(x)$ denotes a sub-polynomial, where i=1 to t. Since the sub-polynomials are prime numbers, the generator polynomial $g(x)$ is given by a product of the respective sub-polynomials as follows:

$$g(x)=m1(x) \times m2(x) \times \ldots \times mt(x) \quad (3)$$

Therefore, the codeword polynomial $C(x)$ of an (n,k) BCH code C can be expressed as:

$$C(x)=\{\{\{\ldots \{\{I(x)m1(x)\} \times m2(x)\} \times \ldots \times mt(x)\}= \\ \text{Concatenation}\{C1, C2, \ldots, Ct\} \quad (4)$$

Equation (4) implies that the existing codeword $C(x)$ can be analyzed as a codeword generated by serial concatenation of t sub-codewords. Therefore, it is noted that the same result can be obtained, even though encoding is performed by dividing an encoder having one codeword into t sub-code encoders.

Figure 2:
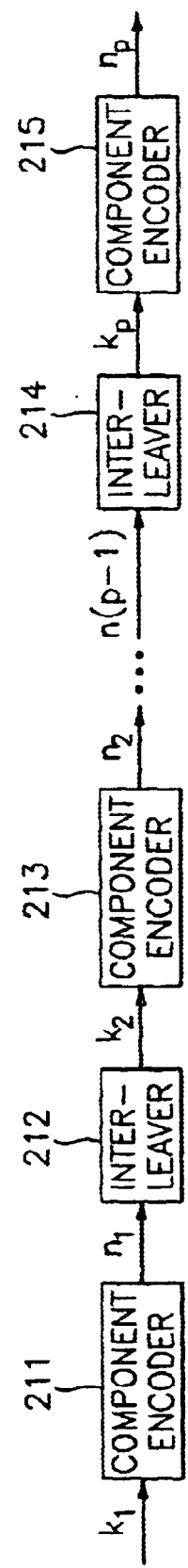
FIG. 2 is a block diagram illustrating a device for encoding an (n,k) linear block code according to an embodiment of the present invention.

An encoder having a serial concatenated structure based on Equation 4 is illustrated in FIG. 2. The encoder includes a plurality of serial concatenated component encoders, and each encoder performs encoding using a different sub-polynomial $mt(x)$. A description of encoding and decoding will be made with reference to linear block codes, by way of example.

Referring to FIG. 2, a component encoder 211 encodes an input information bit stream k1 into a codeword bit stream n1. An interleaver 212 interleaves the codeword bit stream n1 output from the component encoder 211. A component encoder 213 encodes an interleaved codeword bit stream k2 into a codeword bit stream n2. Meanwhile, an interleaver 214 interleaves a codeword bit stream n(p−1) output from a component encoder in the pre-stage. A component encoder 215 encodes the interleaved codeword bit stream kp to output a final codeword bit stream np Here, the interleavers have two operation modes: one is a bypass mode for outputting an input bit stream in the original sequence, and another is a permutation mode using random interleaving, uniform interleaving and non-uniform interleaving. The operation mode of the interleaver is to optimize system performance. When an interleaver is set to bypass mode, a codeword generated from the encoder is identical to a (n,k) BCH code generated from an original encoder. Therefore, the characteristic parameters of the output codeword are all identical to the original parameters. Alternatively, when an interleaver is set to permutation mode, the output codeword becomes an (n,k) linear block code, but the characteristic parameters are different from the original parameters. Therefore, when an interleaver is set to permutation mode, the output codeword may not have the characteristics of the BCH code.

Now, operation of the encoder for a (15,7) BCH code will be described by way of example.

A generator polynomial of the (15,7) BCH code is $g(x)=x^4+x+1$, and this can be divided into two sub-polynomials. From this, the encoder of FIG. 2 can be comprised of two component encoders and one interleaver interposed between the component encoders. A pre-stage component encoder corresponding to one of the two sub-polynomials, encodes 7 input information bits into 11 first codeword bits, 4 of which are added as redundancy bits. The first codeword bits are applied to a post-stage component encoder after interleaving by the interleaver. The post-stage component encoder encodes the 11 codeword bits into 15 final codeword bits, 4 of which are added as redundancy bits. Therefore, the pre-stage component encoder corresponds to a (11,7) BCH code and the post-stage component encoder corresponds to a (15,11) BCH code. Further, a random interleaver is typically used for the interleaver.

It is also possible to group the codewords output from the respective component encoders into another codeword. That is, since a generator polynomial $g(x)$ of the original codeword is divided into t sub-polynomials, it is possible to group them according to code lengths. At this point, the following conditions are satisfied.

Condition 1: Trellis complexity of a new code generated by grouping are lower.

Condition 2: The new code generated by grouping has a good weight spectrum.

Condition 3: A new code generated by grouping, having the longer minimum distance, is preferentially selected.

Condition 4: Every codeword has a systematic code structure.

Figure 3:
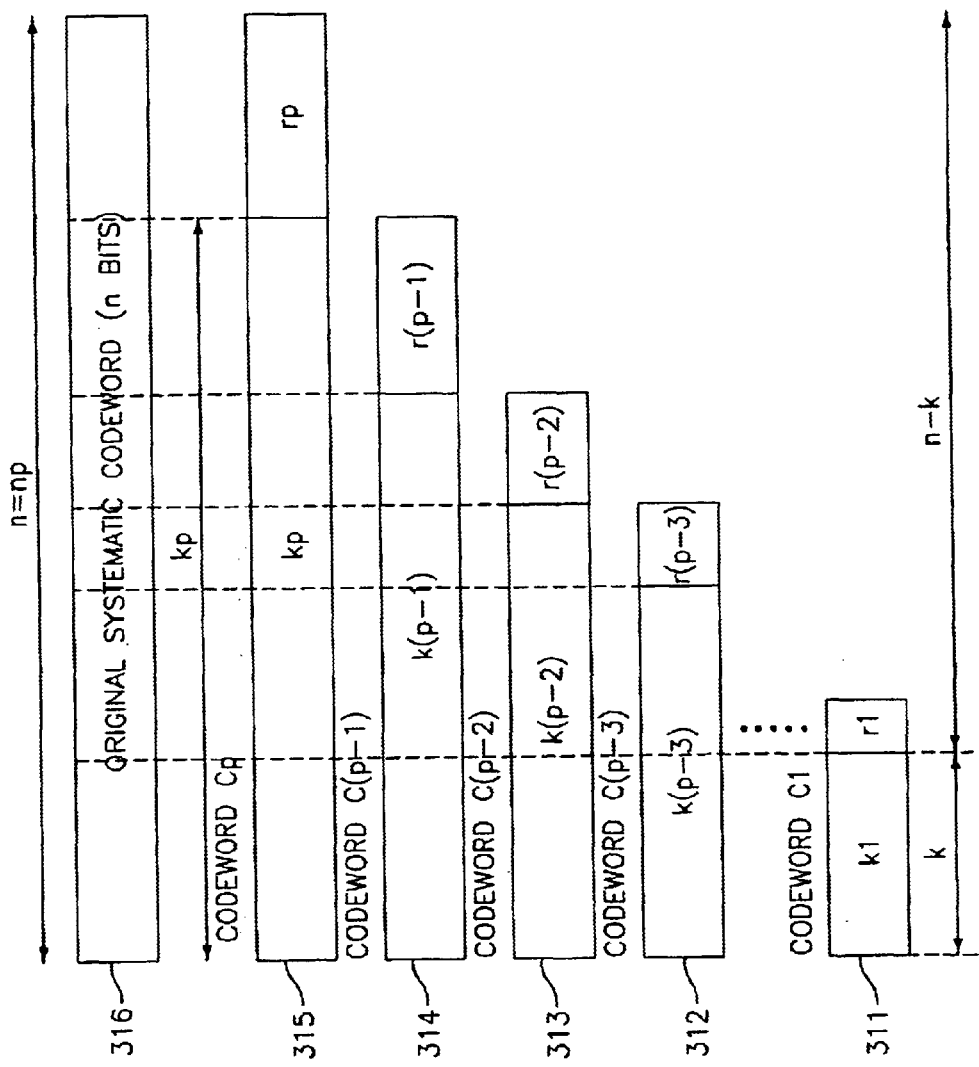
FIG. 3 is a diagram illustrating a format of codewords generated by serial concatenation in accordance with the present invention.

FIG. 3 illustrates a format of codewords generated through an analysis of a serial concatenated code. Referring to FIG. 3, a first codeword 311, the lowest codeword, is generated from a first component encoder, and comprised of an information bit stream k1 and a redundancy bit stream r1. The first codeword 311 is input to a succeeding post-state component encoder and used in generating a upper codeword. A (p−3) codeword 312 is generated from a (p−3) component encoder, and comprised of an information bit stream k(p−3) and a redundancy bit stream r(p−3) provided from a pre-stage. A (p−2) codeword 313 is generated from the (p−3)codeword 312, and comprised of the information bit stream k(p−2) and the redundancy bit stream r(p−2). In the same manner, a final codeword bit stream np is generated by repeatedly performing a corresponding sub-codeword generating process on the lower codeword.

As stated above, all the codewords have the systematic code structure and the upper codeword has more redundancy bits. In other words, a codeword to be transmitted is comprised of k bits, and (n−k) redundancy bits are added thereto.

Various decoding methods corresponding to the encoding method of FIG. 2 are shown in FIGS. 4 to 9.

The decoding methods include a plurality of serially concatenated component decoders each having different generator polynomials. Here, a first-state component decoder can decode either the uppermost codeword 316 or the lowermost codeword 311 of FIG. 3. In the following description, the serial concatenated component decoders perform soft decision, and a MAP (Maximum A Posteriori probability) or SISO (Soft-in, Soft-Output) decoder is typically used for the component decoders. Further, in the following description, it is assumed that a received information bit (or information sample) and a received redundancy bit (or redundancy sample) are unprocessed data bits. The decoder in the receiver decodes a codeword comprised of the information bit stream and the redundancy bit stream by dividing the redundancy bit stream into several redundancy groups and then applying them to the corresponding component decoders, respectively.

Figure 4:
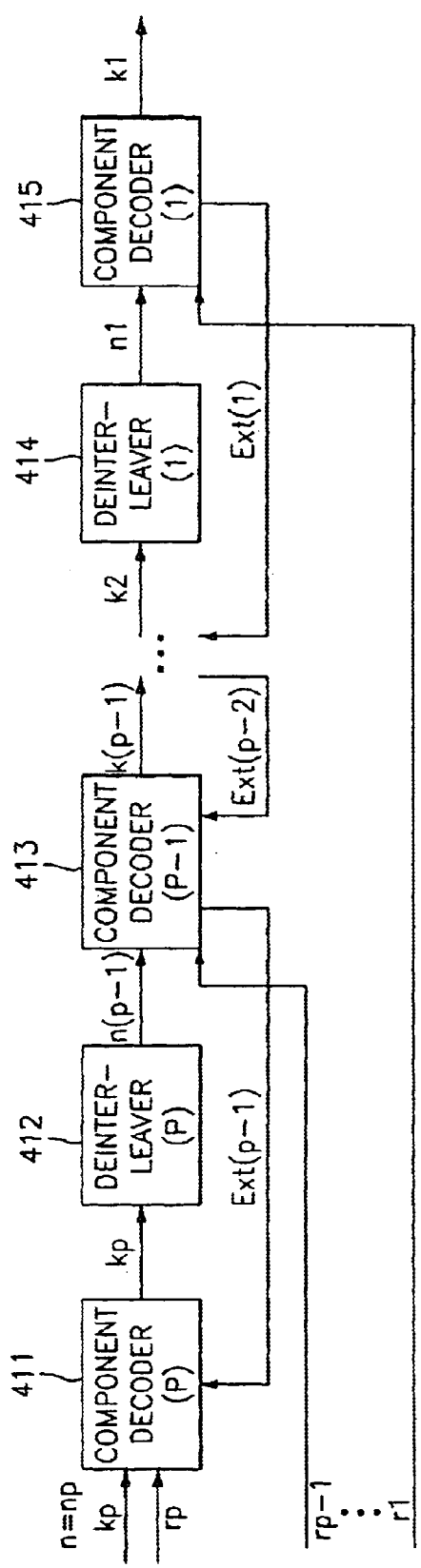
FIG. 4 is a block diagram illustrating a method for iterative decoding serial concatenated (n,k) linear block codes according to a first embodiment of the present invention.

FIG. 4 illustrates a decoder having a serial concatenated structure according to a first embodiment of the present invention, wherein the first-stage component decoder decodes the uppermost codeword 316 of FIG. 3.

Referring to FIG. 4, a component decoder 411 performs MAP/SISO decoding on the received information bit stream kp and its associated redundancy bit stream rp constituting the uppermost codeword, to output a decoded word bit stream kp. A deinterleaver 412 deinterleaves the decoded word bit stream kp in reverse operation of interleaving performed in the transmission side. A component decoder 413 performs MAP/SISO decoding on the decoded word bit stream n(p−1) output from the deinterleaver 412 and its associated received redundancy bit stream r(p−1), to output a decoded word bit stream k(p−1). In this process, the component decoder 413 provides the component decoder 411 with extrinsic information Ext(p−1) for iterative decoding. The component decoder 411 performs the decoding, after the gain of the input bits is adjusted with reference to the extrinsic information provided. A deinterleaver 414 deinterleaves a decoded word bit stream k2 output from a pre-stage component decoder in reverse operation of interleaving performed in the transmission side. A component decoder 415 performs MAP/SISO decoding on the decoded word bit stream n1 output from the deinterleaver 414 and its associated redundancy bit stream r1, to output a decoded final information bit stream k1. And, the component decoder 415 provides a pre-stage component decoder with extrinsic information Ext(1) for iterative decoding.

Figure 5:
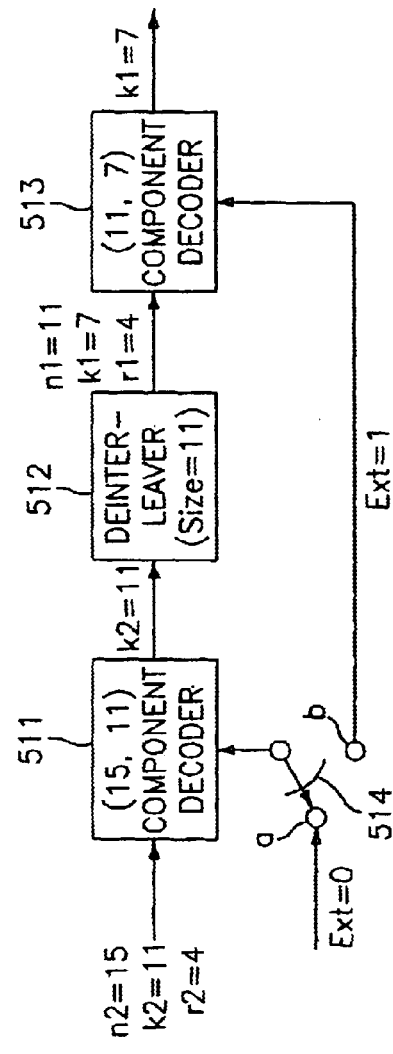
FIG. 5 is a block diagram illustrating the method of FIG. 4, embodied using a (15,7) BCH (Bose, Chaudhuri, Hocquenghem) code.

FIG. 5 shows the decoder wherein the first-stage component decoder decodes the uppermost codeword, for a (15,7) BCH code. Herein, the outer 4 bits out of 8 redundancy bits of the (15,7) BCH code will be referred to as the first redundancy group, and the inner 4 bits will be referred to as the second redundancy group.

Referring to FIG. 5, a component decoder 511 performs MAP/SISO decoding on 11 input information bits and the first redundancy group, to output k2(=11) decoded word bits. A deinterleaver 512 deinterleaves the k2 information bits in reverse operation of interleaving performed in the transmission side. A component decoder 513 performs MAP/SISO decoding on the n1(=11) decoded word bits output from the deinterleaver 512 and the second redundancy group, to output k1(=7) decoded word bits. In this process, the component decoder 513 provides the component decoder 511 with extrinsic information Ext=1 for iterative decoding. Here, the extrinsic information is iterative decoding information indicating reliability of the bits, and the pre-stage component decoder 511 controls a reliability or a gain of the input symbol bits depending on the extrinsic information. A switch 514 is switched to a node 'a' in a first iterative decoding process so as not to provide the extrinsic information to the component decoder 511, and is switched to a node 'b' beginning at a second iterative decoding process so as to provide the extrinsic information to the component decoder 511.

Figure 6:
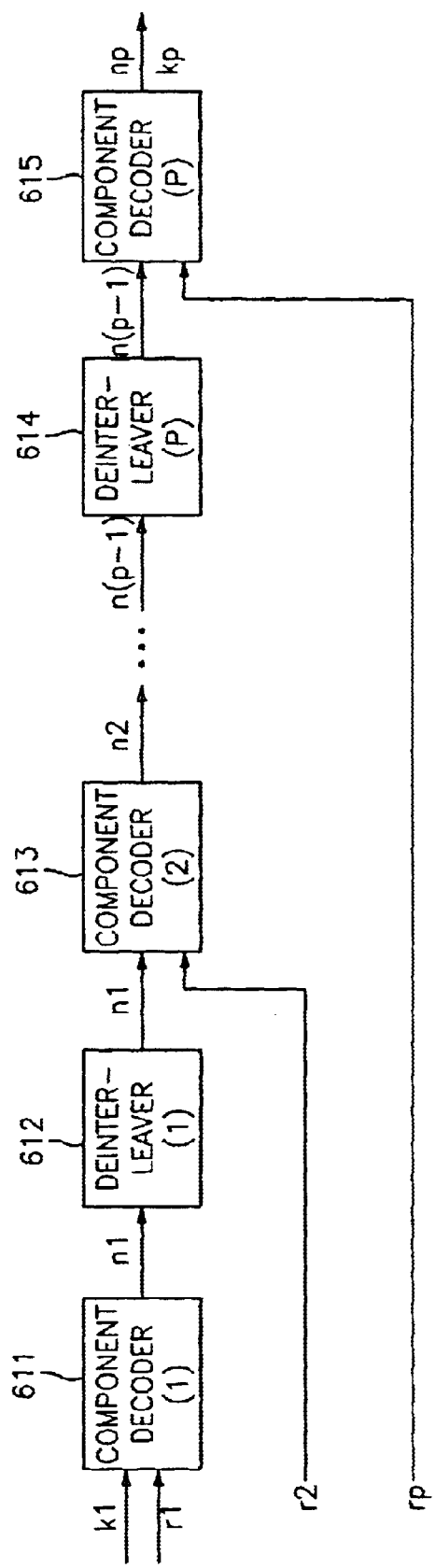
FIG. 6 is a block diagram illustrating a method for iterative decoding serial concatenated (n,k) linear block codes according to a second embodiment of the present invention.

FIG. 6 shows a decoder having a serial concatenated structure according to a second embodiment of the present invention, wherein the first-stage component decoder decodes the lowermost codeword 311 of FIG. 3.

Referring to FIG. 6, a component decoder 611 performs MAP/SISO decoding on the received information bit stream k1 and its associated redundancy bit stream r1 constituting the lowermost codeword, to output a decoded word bit stream n1. A deinterleaver 612 deinterleaves the decoded word bit stream n1 in reverse operation of interleaving performed in the transmission side. A component decoder 613 performs MAP/SISO decoding on the decoded word bit stream n1 output from the deinterleaver 612 and its associated received redundancy bit stream r2, to output a decoded word bit stream n2. A deinterleaver 614 deinterleaves a decoded word bit stream output from a pre-stage component decoder in reverse operation of interleaving performed in the transmission side. A component decoder 615 performs MAP/SISO decoding on the decoded word bit stream n(p−1) output from the deinterleaver 614 and its associated redundancy bit stream rp, to output a final decoded word bit stream np. Here, the deinterleavers can operate in the bypass mode or in the permutation mode depending upon the interleaving operation mode of the transmitter.

Figure 7:
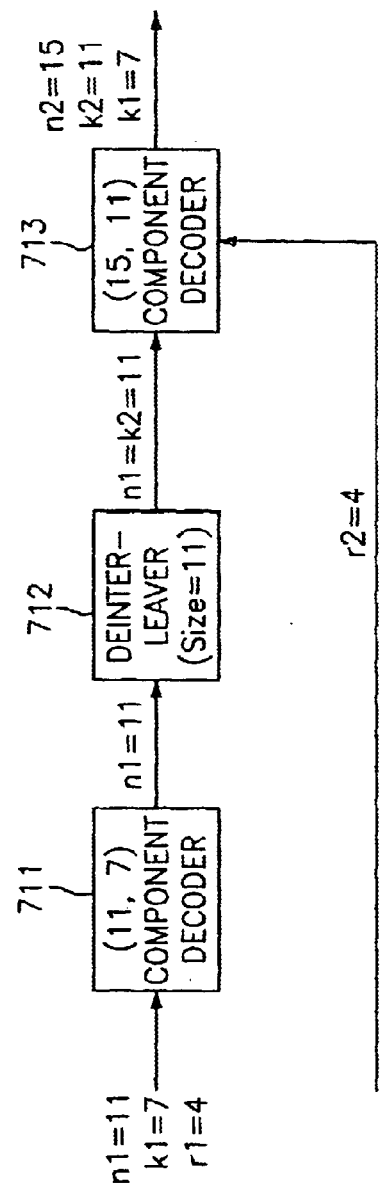
FIG. 7 is a block diagram illustrating the method of FIG. 6, embodied using a (15,7) BCH code.

FIG. 7 shows the decoder wherein the first-stage component decoder decodes the lowermost codeword, for a (15,7) BCH code. Herein, the inner 4 bits out of 8 redundancy bits of the (15,7) BCH code will be referred to as a first redundancy group, and the outer 4 bits will be referred to as a second redundancy group.

Referring to FIG. 7, a component decoder 711 performs MAP/SISO decoding on k1=7 input information bits and the first 5-bit redundancy group r1, to output n1(=11) decoded word bit stream. A deinterleaver 712 deinterleaves the n1 information bits in reverse operation of interleaving performed in the transmission side. A component decoder 713 performs MAP/SISO decoding on the n2(=11) decoded word bit stream output from the deinterleaver 712 and the second 4-bit redundancy group r2, to output n2(=15) decoded final word bit stream.

Figure 8:
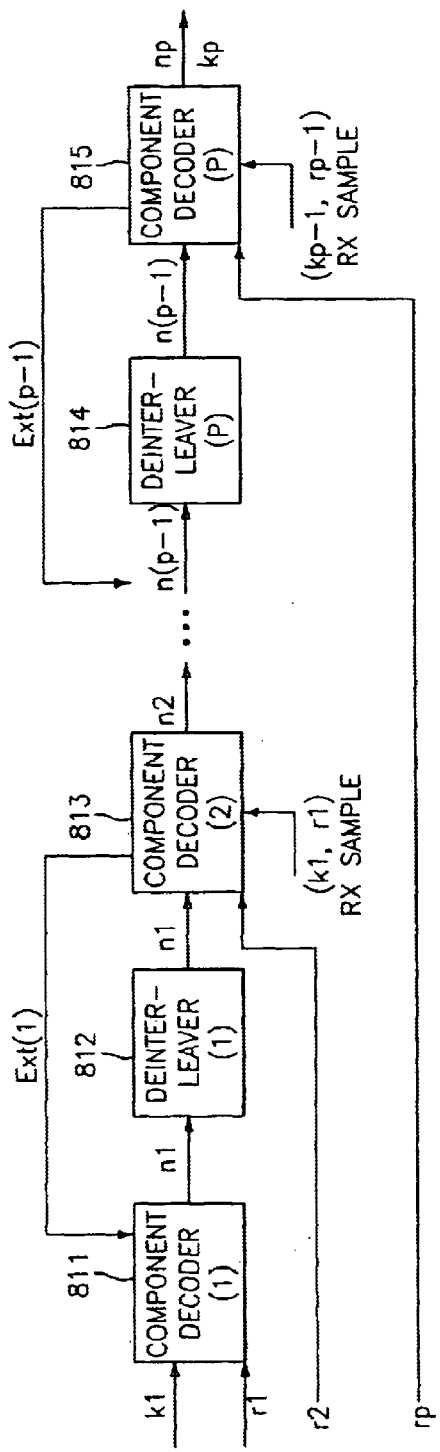
FIG. 8 is a block diagram illustrating a method for iterative decoding a serial concatenated (n,k) linear block codes according to a third embodiment of the present invention.

FIG. 8 shows a decoder having a serial concatenated structure according to a third embodiment of the present invention, wherein each component decoder provides resulting extrinsic information obtained by decoding to its pre-stage component decoder. Here, the extrinsic information is iterative decoding information, and the pre-stage component decoder controls a gain of the input symbol bits depending on the extrinsic information.

Referring to FIG. 8, a component decoder 811 performs MAP/SISO decoding on the received information bit stream k1 and its associated redundancy bit stream r1, to output a decoded word bit stream n1. A deinterleaver 812 deinterleaves the decoded word bit stream n1 in reverse operation of interleaving performed in the transmission side. A component decoder 813 performs MAP/SISO decoding on the decoded word bit stream n1 output from the deinterleaver 812 and its associated received redundancy bit stream r2, to output a decoded word bit stream n2. In this process, the component decoder 813 provides the component decoder 811 with extrinsic information Ext(1) for iterative decoding. The component decoder 811 then controls a reliability or a gain of the input bit stream depending on the provided extrinsic information and continues decoding. The component decoder 813 performs MAP/SISO decoding on the received information bit stream n1 and its associated received redundancy bit stream r2, to output a decoded word bit stream n2. A deinterleaver 814 deinterleaves a decoded word bit stream output from a pre-stage component decoder in reverse operation of the interleaving performed in the transmission side. A component decoder 815 performs MAP/SISO decoding on the decoded word bit stream n(p−1) output from the deinterleaver 814 and its associated redundancy bit stream rp, to output a decoded final word bit stream np. And, the information word beat K is extracted from the decoded final word bit stream np. In this process, the component decoder 815 provides a pre-stage component decoder with extrinsic information Ext(p−1) for iterative decoding. The pre-stage component decoder then controls a reliability or a gain of the input bits depending on the provided extrinsic information and continues decoding. Here, if the component decoders are in a good channel condition, the decoding is performed using the received sample. As illustrated in the figure, if the component decoder 813 is in a good channel condition, the decoding is performed using the received sample (k1, r1). Also, the deinterleavers can operate in the bypass mode or in the permutation mode depending upon the interleaving operation mode of the transmitter.

Figure 9:
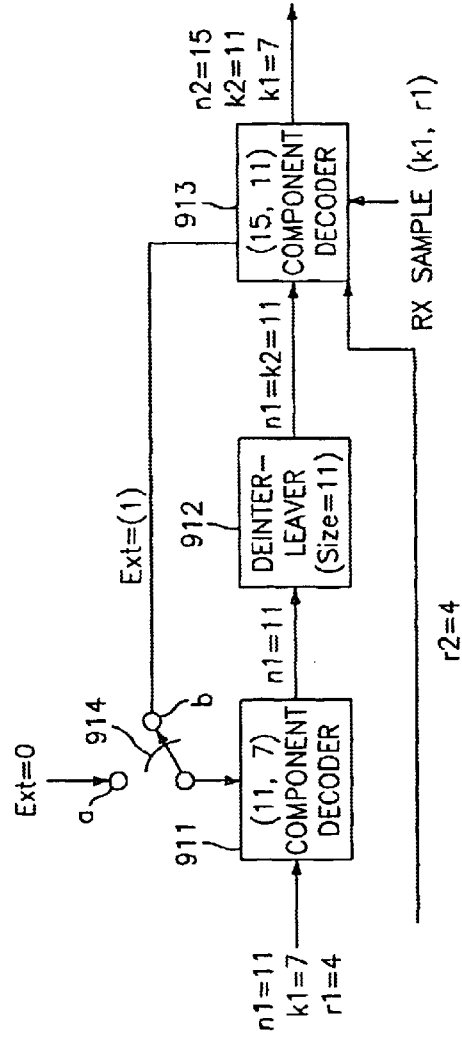
FIG. 9 is a block diagram illustrating the method of FIG. 8, embodied using a (15,7) BCH code.

FIG. 9 shows the decoder wherein the first-stage component decoder decodes the lowermost codeword 311, for a (15,7) BCH code. Herein, each component decoder provides resulting extrinsic information obtained by decoding to its pre-stage component decoder. Further, the inner 4 bits out of 8 redundancy bits of the (15,7) BCH code will be referred to as a first redundancy group, and the outer 4 bits will be referred to as a second redundancy group.

Referring to FIG. 9, a component decoder 911 performs MAP/SISO decoding on k1(=7) input information bits and the first redundancy group r1 constituting the lowermost codeword, to output n1(=11) decoded word bits. A deinterleaver 912 deinterleaves the n1 decoded word bits output from the component decoder 911 in reverse operation of interleaving performed in the transmission side. A component decoder 913 performs MAP/SISO decoding on the n1 (=11) decoded word bits output from the deinterleaver 912 and the second redundancy group r2, to output n2(=15) decoded word bit stream. In this process, the component decoder 913 provides the component decoder 911 with extrinsic information Ext1 for iterative decoding. A switch 914 is switched to a node 'a' in a first iterative decoding process so as not to provide the extrinsic information to the component decoder 911, and is switched to a node 'b' beginning at a second iterative decoding process so as to provide the extrinsic information to the component decoder 911. And, if the component decoder 913 is in a good channel condition, the decoding is performed using the received sample (k1, r1). Here, the deinterleaver can operate in the bypass mode or in the permutation mode in dependence upon the interleaving operation mode of the transmitter.

The novel decoders have a reduced trellis complexity for soft decision as compared with the existing decoder.

For example, for a (15,7) linear block code, the existing decoder has a trellis complexity of $2^{(15-7)}=256$. However, the novel decoders have a reduced trellis complexity of $2^4=16$, since (n−k)=4 in each decoding stage. That is, the novel decoders have trellis complexity, which is $16/256=1/16$ times the trellis complexity of the existing decoder.

As described above, the present invention proposes a new soft decision method for linear block codes, which is intensively used in a radio communication system. The invention reduces the trellis size for soft decision of the linear block codes, thereby reducing the complexity. In addition, the invention proposes a decoding method for minimizing the post information bit error probability, as compared with the existing ML decoding method.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An encoding device for encoding input information bits using a generator polynomial represented by a product of a plurality of sub-polynomials, comprising:

a plurality of serial concatenated encoders each having different respective generator polynomials, wherein said generator polynomial is a product of the respective generator polynomials and each respective generator polynomial is represented by one of the plurality of sub-polynomials or by a product of sub-polynomials, and a first-stage encoder out of the serial concatenated encoder receives said input information bits.

2. The encoding device as claimed in claim 1, further comprising an interleaver interposed between the encoders, for interleaving an output of a pre-stage encoder.

3. A decoding device for decoding an input codeword bit stream using a generator polynomial represented by a product of a plurality of sub-polynomials, comprising:

a plurality of serial concatenated decoders each having different generator polynomials, wherein said generator polynomial is a product of the respective generator polynomials and each respective generator polynomial is represented by one of the plurality of sub-polynomials or by a product of sub-polynomials, and a first-stage decoder out of the serial concatenated decoders receives said input codeword bit stream.

4. The decoding device as claimed in claim 3, wherein the decoders each perform soft decision.

5. The decoding device as claimed in claim 3, wherein the codeword is a linear block code.

6. A decoding device for decoding a codeword comprised of k information bits and r redundancy bits, the device comprising:

a plurality of serial concatenated decoders, wherein the r redundancy bits are grouped into a plurality of redundancy groups each being applied to a corresponding serial concatenated decoder, a first-stage decoder decodes the k information bits and the r redundancy bits, and the corresponding serial concatenated decoders each decode a decoding result from a pre-stage decoder and an associated redundancy group thereof.

7. The decoding device as claimed in claim 6, wherein the decoders each perform soft decision.

8. The decoding device as claimed in claim 6, wherein the codeword is a linear block code.

9. The decoding device as claimed in claim 6, further comprising a deinterleaver interposed between the decoders, for deinterleaving an output of a pre-stage decoder.

10. The decoding device as claimed in claim 6, wherein the decoders each provide extrinsic information for iterative decoding, said extrinsic information indicating reliability of the decoded word, to a pre-stage decoder after decoding, and the pre-stage decoder controls a gain of input symbol bits depending on the extrinsic information.

11. The decoding device as claimed in claim 6, wherein the first-stage decoder receives the extrinsic information indicating the reliability of the encoded word from the second decoding, from the latter-stage decoder.

12. A decoding device for decoding a codeword comprised of k information bits and r redundancy bits, the device comprising:
a plurality of serial concatenated decoders, wherein the r redundancy bits are grouped into a plurality of redundancy groups each being applied to a corresponding serial concatenated decoder, a first-stage decoder decodes an information bit stream and a redundancy corresponding to a first one of the redundancy groups, and the corresponding serial concatenated decoders each decode a decoding result from a pre-stage decoder and an associated redundancy group thereof.

13. The decoding device as claimed in claim 12, wherein the decoders each perform soft decision.

14. The decoding device as claimed in claim 12, wherein the codeword is a linear block code.

15. The decoding device as claimed in claim 12, further comprising a deinterleaver interposed between the decoders, for deinterleaving an output of a pre-stage decoder.

16. The decoding device as claimed in claim 12, wherein the decoders each provide extrinsic information for iterative decoding, said extrinsic information indicating reliability of the encoded word, to a pre-stage decoder thereof after decoding, and the pre-stage decoder controls a gain of input symbol bits depending on the extrinsic information.

17. The decoding device as claimed in claim 12, wherein the firststage decoder receives the extrinsic information indicating the reliability of the encoded word from the second decoding, from the latter-stage decoder.

* * * * *